(12) United States Patent
Morimoto et al.

(10) Patent No.: US 7,023,014 B2
(45) Date of Patent: Apr. 4, 2006

(54) NON-VOLATILE MEMORY AND FABRICATION METHOD THEREOF

(75) Inventors: Kiyoshi Morimoto, Hirakata (JP); Hideyuki Tanaka, Hirakata (JP); Takashi Ohtsuka, Toyonaka (JP); Akihito Miyamoto, Hirataka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 84 days.

(21) Appl. No.: 10/716,621

(22) Filed: Nov. 20, 2003

(65) Prior Publication Data

US 2004/0109351 A1    Jun. 10, 2004

(30) Foreign Application Priority Data

Jul. 11, 2002 (JP) .............................. 2002-202487
Jul. 1, 2003 (WO) ....................... PCT/JP03/08349

(51) Int. Cl.
*H01L 29/18* (2006.01)
(52) U.S. Cl. .......................... 257/42; 438/102; 438/103
(58) Field of Classification Search ................ 257/42; 438/102–103
See application file for complete search history.

(56) References Cited

U.S. PATENT DOCUMENTS

| | | | |
|---|---|---|---|
| 4,845,533 A | | 7/1989 | Pryor et al. |
| 5,296,716 A | | 3/1994 | Ovshinsky et al. |
| 5,825,046 A | | 10/1998 | Czubatyj et al. |
| 6,475,911 B1 * | | 11/2002 | Lane ........................... 438/686 |
| 6,844,564 B1 * | | 1/2005 | Tanaka et al. ................... 257/3 |
| 6,917,532 B1 * | | 7/2005 | Van Brocklin et al. ....... 365/51 |
| 2001/0034116 A1 * | | 10/2001 | Lee et al. .................... 438/604 |
| 2002/0017675 A1 | | 2/2002 | Tanaka |
| 2003/0011013 A1 * | | 1/2003 | Joo et al. ..................... 257/309 |
| 2003/0027416 A1 * | | 2/2003 | Moore ......................... 438/618 |
| 2003/0045736 A1 * | | 3/2003 | Saito .............................. 556/1 |
| 2003/0073262 A1 * | | 4/2003 | Xu et al. ..................... 438/102 |
| 2004/0001374 A1 * | | 1/2004 | Tanaka et al. .............. 365/200 |
| 2005/0045864 A1 * | | 3/2005 | Tanaka et al. ................. 257/5 |

FOREIGN PATENT DOCUMENTS

| | | |
|---|---|---|
| EP | 269225 | 6/1988 |
| JP | 63-142690 | 6/1988 |
| JP | 04-045583 | 2/1992 |
| JP | 08-070100 | 3/1996 |
| JP | 11-297943 | 10/1999 |
| JP | P2001-189431 | 7/2001 |
| JP | P2003-229538 | 8/2003 |
| WO | WO 97/05665 | 2/1997 |
| WO | WO 97/40499 | 10/1997 |
| WO | WO 98/03134 | 1/1998 |
| WO | WO 98/19350 | 5/1998 |

* cited by examiner

*Primary Examiner*—Christian D. Wilson
(74) *Attorney, Agent, or Firm*—McDermott Will & Emery LLP

(57) ABSTRACT

The present invention relates to a non-volatile memory comprising: a first electrode (11); a second electrode (12); and a phase-change recording medium (14) sandwiched between the first electrode (11) and the second electrode (12), in which resistance value is varied by applying an electrical pulse across the first electrode (11) and the second electrode (12), at least one of the first electrode (11) and the second electrode (12) contains as a main ingredient at least one member selected from the group consisting of ruthenium, rhodium and osmium, and the phase-change recording medium (14) is formed of a phase-change material that contains chalcogen(s). This non-volatile memory exhibits improved durability and reliability by preventing deterioration of property (i.e., mutual impurity diffusion between the electrode and the phase-change recording medium) caused by application of current.

16 Claims, 16 Drawing Sheets

(a)

(b)

(a)

(b)

(a)

(b)

(c)

(a)

(b)

(a)

(b)

(c)

(a)

(b)

(a)

(b)

(c)

NON-VOLATILE MEMORY AND FABRICATION METHOD THEREOF

TECHNICAL FIELD

The present invention relates to a non-volatile memory and a fabrication method thereof, and more particularly to a non-volatile memory in which data can be recorded (written) or deleted by applying current to control resistance value variation, and to the fabrication method thereof.

BACKGROUND OF THE INVENTION

In recent years, there has been strong demand for a non-volatile memory that operates at high speed with little power consumption and that is compact but still has a large storage capacity, because there is an increased need for processing high-volume image information even in such devices as portable telephones and personal digital assistants (PDAs). A ferroelectric memory disclosed, for example, in the specification of USP Published Application No. 2002/017675 (Japanese Unexamined Patent Publication No. 2001-298162) is a known non-volatile memory. Recently, a memory that uses the property that the resistance value of a bulk varies depending on the condition of its crystal (i.e., so-called phase-change memory) has received widespread attention as a memory that is both super-integrated and capable of non-volatile operation. Phase-change memories are disclosed, for example, in the specification of U.S. Pat. No. 5,296,716 and WO97/40499A1 (Japanese Unexamined Patent Publication No. 2000-509204).

A phase-change memory is structured so as to hold a phase-change film that comprises a plurality of chalcogens between two electrodes, wherein Joule's heat is applied to the phase-change film by applying current across the two electrodes to change the condition of crystals between non-crystalline and crystalline phases, thereby performing electrical switching. For example, in GeSbTe-based phase-change materials and the like, a plurality of crystalline phases coexist, and, theoretically, it is possible to change the resistance value between the two electrodes in an analog fashion. Therefore, GeSbTe base phase-change materials are anticipated to be useful as analog (multivalued) memories as well as memories for digital circuits. Because the crystalline condition of a memory activity region is extremely stable at room temperature, it is assumed that it is possible to sufficiently retain memory over 10 years.

In such a phase-change memory, when the crystalline condition is changed from a low resistance condition to a high resistance condition, the temperature of the memory active region is locally raised to a high temperature and the temperature is expected to reach approximately 600° C. However, when a device is fabricated using a phase-change film formed of GeSbTe, for example, by sandwiching it between aluminum thin films, which are generally used in LSI fabricating processes, mutual reaction between the phase-change film and the aluminum film occurs by heat treatment, even at 100° C., significantly impairing the performance of the device. Therefore, high thermal stability is needed in the material for the electrodes that sandwich a phase-change material in between and prevention of impurity diffusion is required to avoid the elements composing the electrodes from mixing into the phase-change material.

WO97/05665A1 (National publication of the translated version of PCT application No. 1999-510317) discloses a structure wherein a thin film contact layer containing at least one element selected from the group consisting of Ti, V, Cr, Zr, Nb, Mo, Hf, Ta and W and two or more members selected from the group consisting of B, C, N, O, Al, Si, P, S, and their mixtures or alloys, is provided between a phase-change film and an electrode. However, even in a phase-change memory having such compositions, since it is difficult to achieve satisfactory heat resistance and prevention of impurity diffusion, there results the problem that the possible number of rewrite cycles is not enough to use it as an alternative to widely used general-purpose memories such as DRAMs (dynamic random access memories) and SRAMs (static random access memories).

SUMMARY OF THE INVENTION

The present invention aims to solve such problems and provide a non-volatile memory in which deterioration of its properties caused by application of current is prevented, thereby increasing its durability and reliability, and a fabrication method thereof.

One object of the present invention can be achieved by a non-volatile memory comprising:
a first electrode;
a second electrode; and
a phase-change recording medium sandwiched between the first electrode and the second electrode, in which resistance value is varied by application of an electrical pulse across the first electrode and the second electrode; and in which
at least one of the first electrode and the second electrode contains as a main ingredient at least one member selected from the group consisting of ruthenium, rhodium and osmium; and
the phase-change recording medium is formed from a phase-change material containing chalcogen(s).

One object of the present invention can be achieved by a method for fabricating a non-volatile memory comprising the steps of:
forming a first electrode that contains as a main ingredient at least one member selected from the group consisting of ruthenium, rhodium and osmium on a substrate having an insulator in between;
forming an insulating layer on the first electrode;
forming a throughhole in the insulating layer by photolithography;
forming a phase-change recording medium that comprises a standing portion filling in the throughhole and a layered portion formed on the surface of the insulating layer by depositing a phase-change material containing chalcogen(s) on the insulating layer; and
forming a second electrode that contains as a main ingredient at least one member selected from the group consisting of ruthenium, rhodium and osmium on the phase-change recording medium.

DISCLOSURE OF THE INVENTION

Embodiments of the present invention will be described below with reference to the accompanying drawings.

(First Embodiment)

Figure 1:
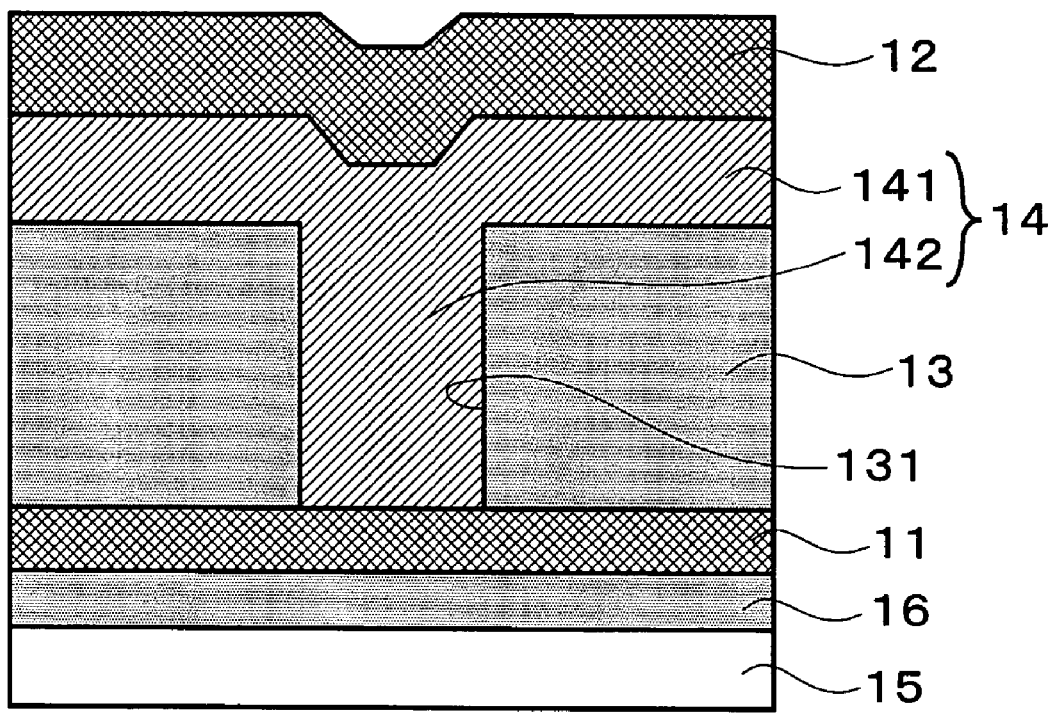
FIG. 1 is a cross-sectional view showing the main parts of a non-volatile memory according to the first embodiment of the present invention.

FIG. 1 is a cross-sectional view showing the main parts of a non-volatile memory according to the first embodiment of the present invention. As shown in FIG. 1, a non-volatile memory 1 comprises an insulating layer 13 and a phase-change recording medium 14 sandwiched between a lower electrode 11 and an upper electrode 12.

The lower electrode 11 is a high-melting-point metal thin film that contains ruthenium (Ru) as a main ingredient and that is formed on a substrate 15 made of silicon, etc., having an insulator 16 made of silicon oxide, silicon nitride, glass and the like in between. As with the lower electrode 11, the upper electrode 12 is a high-melting-point metal thin film that contains ruthenium (Ru) as a main ingredient.

The insulating layer 13, formed on the lower electrode 11, is made of the same material as the insulator 16 and provided with a throughhole 131 extending through the layer from the front surface to the rear surface thereof. The phase-change recording medium 14 is formed of a phase-change material containing chalcogen(s) such as GeSbTe compounds, etc. The phase-change recording medium 14 comprises a layered portion 141 sandwiched between the upper electrode 12 and the insulating layer 13, and a standing portion 142 that fills in the throughhole 131 so as to electrically connect the layered portion 141 and the lower electrode 11. The standing portion 142 is formed in a straight tube shape in such a manner that it extends substantially perpendicular to the layered portion 141. It is preferable that the cross sectional outer edge of the standing portion 142 fall in the area having the dimension of from 10 nm? (a square 10 nm on each side, the same holds true with the following) to 10 µm? (inclusive), and more preferably from 50 nm? to 1 µm? (inclusive).

In a non-volatile memory 1 having such a structure, when a voltage is applied across the lower electrode 11 and the upper electrode 12 to generate Joule's heat, the crystalline condition of the phase-change material that forms the standing portion 142 changes, resulting in a change of resistance value. In other words, in a crystalline state (set state), the resistance value is small, on the other hand, in an amorphous state (reset state), the resistance value is large. Generally, the difference in resistance value between the two states becomes approximately a two-digit number.

To change a memory from a set state to a reset state, it is necessary to heat the phase-change material of the standing portion 142 to its melting point and rapidly cool it to turn it into an amorphous state. Under this condition, the temperature of the standing portion 142 rises to approximately 600° C. In the present embodiment, since the lower electrode 11 and the upper electrode 12 contain Ru (melting point: 2310° C.), which is a high-melting-point metal, as a main ingredient, it is possible to obtain high heat resistance and prevent mutual impurity diffusion. This prevents the lower electrode 11 and the upper electrode 12 from mutually diffusing due to heating with the phase-change recording medium 14, resulting in preventing deterioration of the property of memory.

Figure 2:
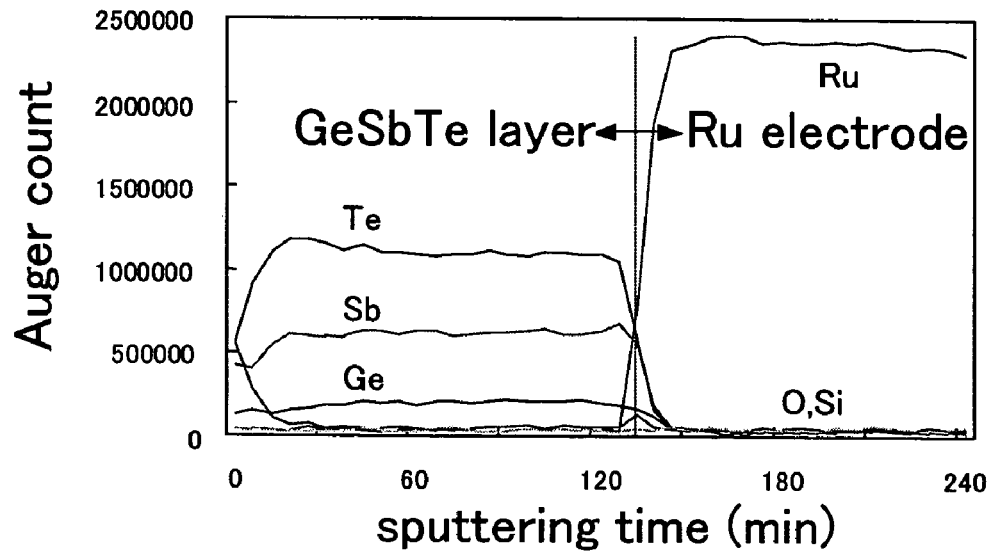
FIGS. 2(a) and (b) show the results of elementary analysis conducted around an interface between the phase-change recording medium formed of GeSbTe and an electrode formed of Ru.
Figure 2:
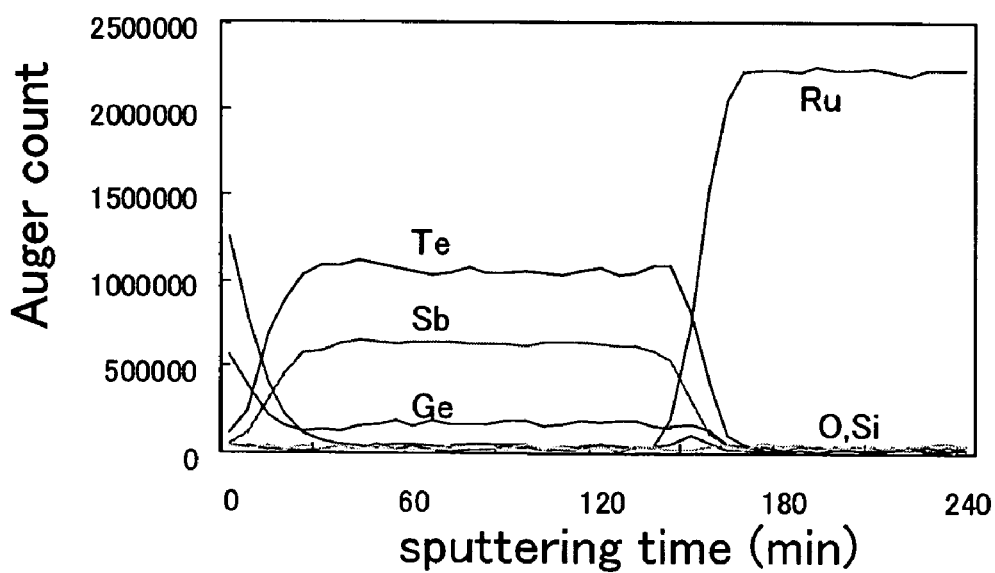
Figure 3:
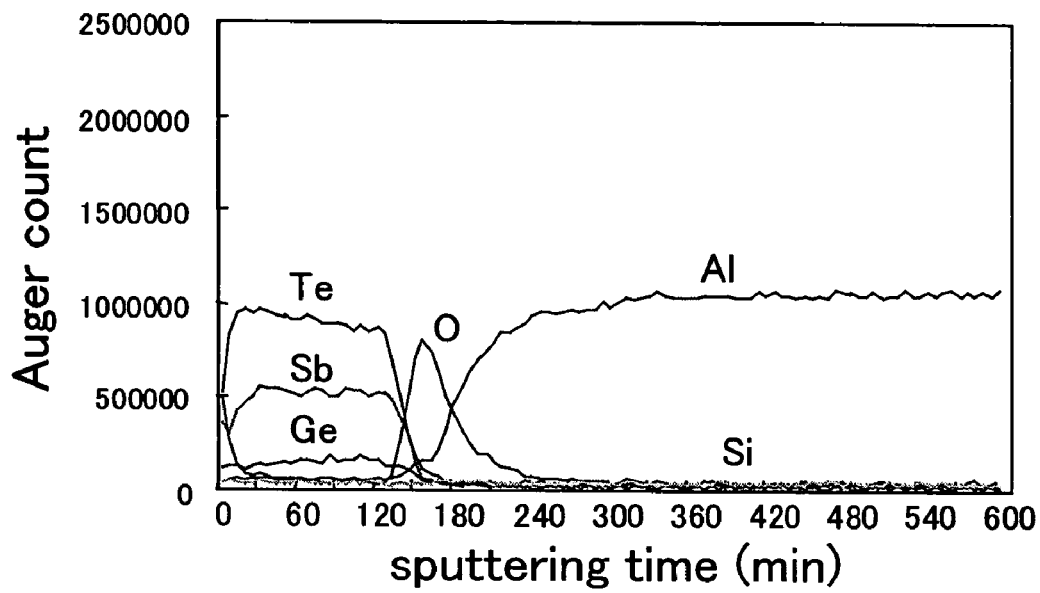
FIGS. 3(a) and (b) show the results of elementary analysis conducted around an interface between the phase-change recording medium formed of GeSbTe and an electrode formed of Al.
Figure 3:
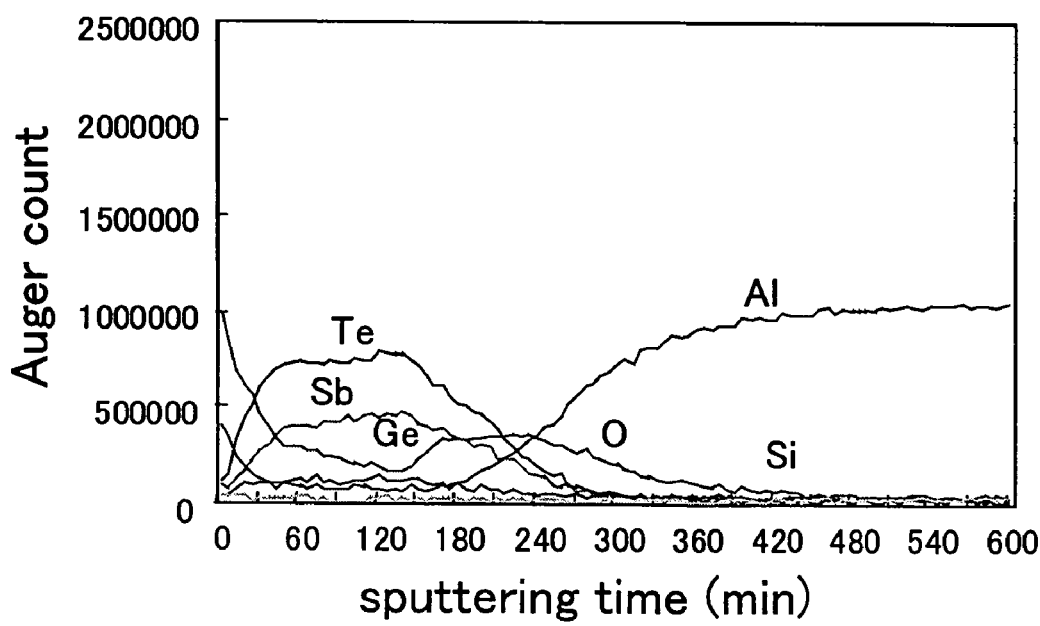

FIG. 2 shows the results of elementary analysis by Auger electron spectroscopy conducted around an interface between a phase-change recording medium formed of GeSbTe and an electrode formed of Ru. FIG. 3 shows the results of elementary analysis conducted around an interface between a phase-change recording medium formed of GeSbTe and an electrode formed of Al by following the same process as in FIG. 2. In FIGS. 2 and 3, (a) indicates the state before heating and (b) indicates the state after heating. Heat treatment was conducted in air at 300° C. for 2 min.

When comparison between FIG. 2(a) and FIG. 2(b) is made, it is apparent that the structure around the interface has not changed after heat treatment. This makes it clear that the mutual impurity diffusion between the electrode and the phase-change recording medium is prevented by using Ru as an electrode material. In contrast, when comparison between FIG. 3(a) and FIG. 3(b) is made, it can be seen that the extent of the GeSbTe after heat treatment has become larger than that before heat treatment, and the steepness of the interface has decreased. This makes it clear that when Al is used as a material for the electrode, significant mutual impurity diffusion between the electrode and the phase-change recording medium occurs.

From the viewpoint of heat resistance, prevention of mutual impurity diffusion, processability, etc., it is preferable that the lower electrode 11 and the upper electrode 12 contain ruthenium (Ru) as a main ingredient as described above; however, it is also possible to use electrodes that contain other high-melting-point-metals such as rhodium (Rh) and osmium (Os) as a main ingredient. They may also contain two or more members selected from ruthenium (Ru), rhodium (Rh) and osmium (Os) as main ingredients. Note that the lower electrode 11 and the upper electrode 12 may consist of ruthenium (Ru), rhodium (Rh) or osmium (Os). Alternatively, the lower electrode 11 and the upper electrode 12 may consist of an alloy formed of two or three metals selected from ruthenium (Ru), rhodium (Rh) and osmium (Os). It is also possible to form either of the lower electrode 11 or the upper electrode 12 so as to contain the above-described high-melting-point metal as a main ingredient and form the other one from a conventionally used electrode material. Melting points of each metal are as follows: ruthenium (Ru): 2310° C., rhodium (Rh): 1955° C., osmium (Os): 2700° C.

(Second Embodiment)

Figure 4:
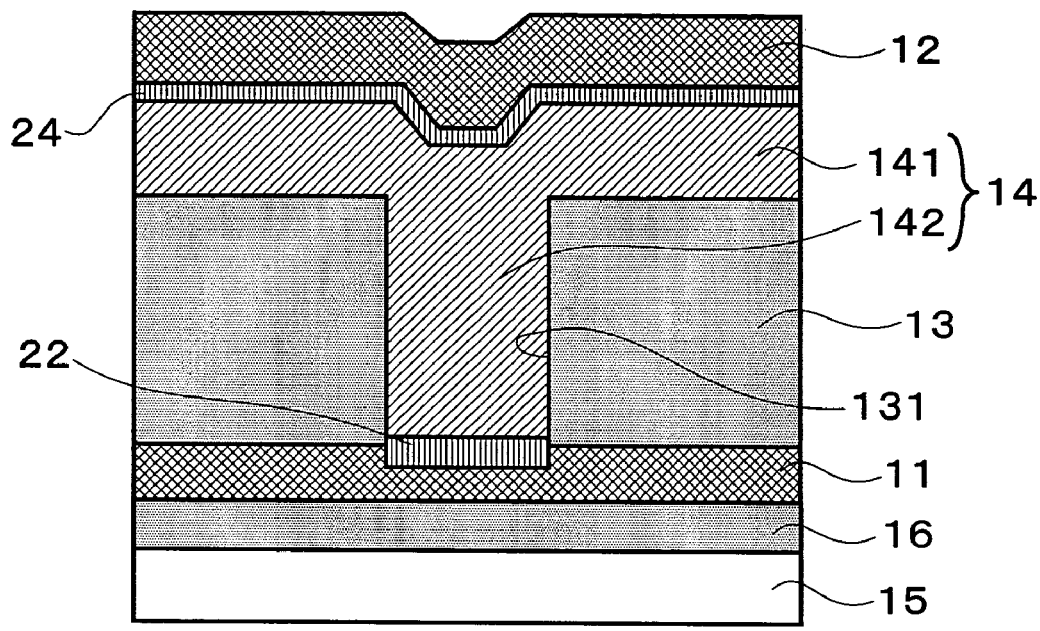
FIG. 4 is a cross-sectional view showing the main parts of a non-volatile memory according to the second embodiment of the present invention.

FIG. 4 is a cross-sectional view showing the main parts of a non-volatile memory according to the second embodiment of the present invention.

The non-volatile memory shown in FIG. 4 has a structure in which a lower metal-oxide layer 22 and an upper metal-oxide layer 24 are disposed between the lower electrode 11 and the phase-change recording medium 14 and between the phase-change recording medium 14 and the upper electrode 12, respectively, of the non-volatile memory shown in FIG. 1. In other respects, the constitution is the same as that of the non-volatile memory shown in FIG. 1. Therefore, the same reference numbers are used for the same constituent components and a detailed explanation thereof is omitted.

The lower metal-oxide layer 22 and the upper metal-oxide layer 24 comprise at least one high-melting-point oxide selected from the group of metals consisting of ruthenium (Ru), rhodium (Rh), iridium (Ir) and osmium (Os). Such a metal oxide is a conductive oxide having a tetragonal rutile structure that exhibits a resistivity of 30 to 100 μ?·cm, which is as low as that of metals, extremely high heat stability and impurity diffusion efficiency (see Journal of Electrochemical Society, Solid-State Science and Technology, Vol. 135, No. 10, page 2610).

Figure 5:
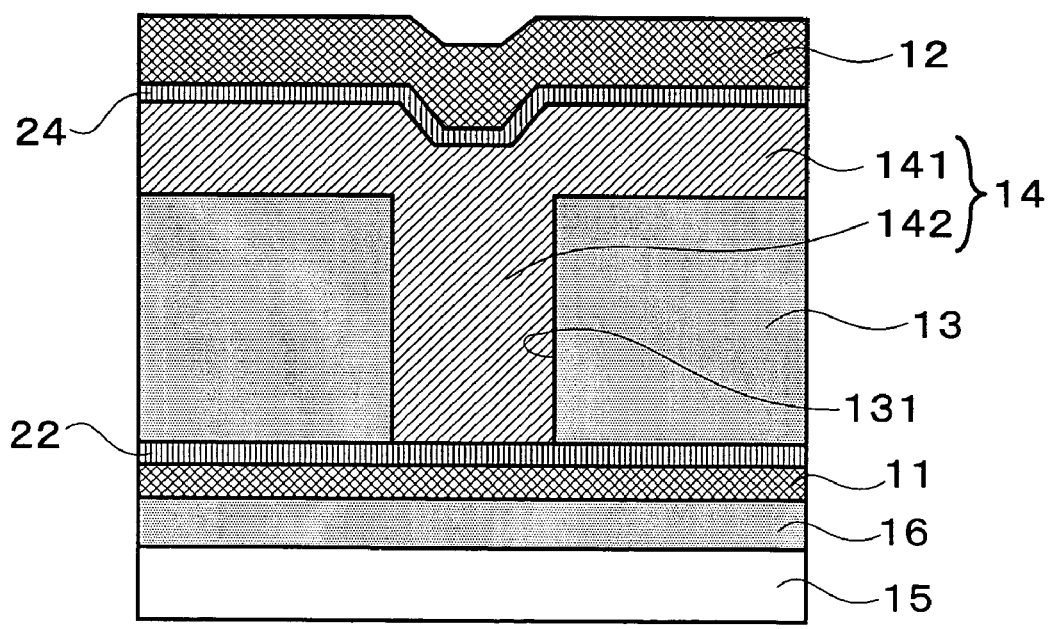
FIG. 5 is a cross-sectional view showing the main parts of a non-volatile memory according to a modified example of the second embodiment of the present invention.

In FIG. 4, the lower metal-oxide layer 22 is formed only in the region where the standing portion 142 of the phase-change recording medium 14 overlays the lower electrode 11 as seen in a plan view. However, as shown in FIG. 5, it is also possible to form the lower metal-oxide layer 22 on the entire surface of the lower electrode 11 in such a manner that the standing portion 142 comes into contact with a portion of the lower metal-oxide layer 22. Alternatively, it is possible to form only one of the lower metal-oxide layer 22 and the upper metal-oxide-layer 24.

Since the oxide conductive materials that form the lower metal-oxide layer 22 and the upper metal-oxide layer 24 have a low thermal conductivity compared to the high-melting-point metals that form the lower electrode 11 and the upper electrode 12, it is possible to reduce heat dissipation from the standing portion 142 by providing the lower metal-oxide layer 22 and the upper metal-oxide layer 24. The temperature of the standing portion 142 thereby can be raised to its melting point with little applied current, reducing the power consumption required for resetting.

Figure 6:
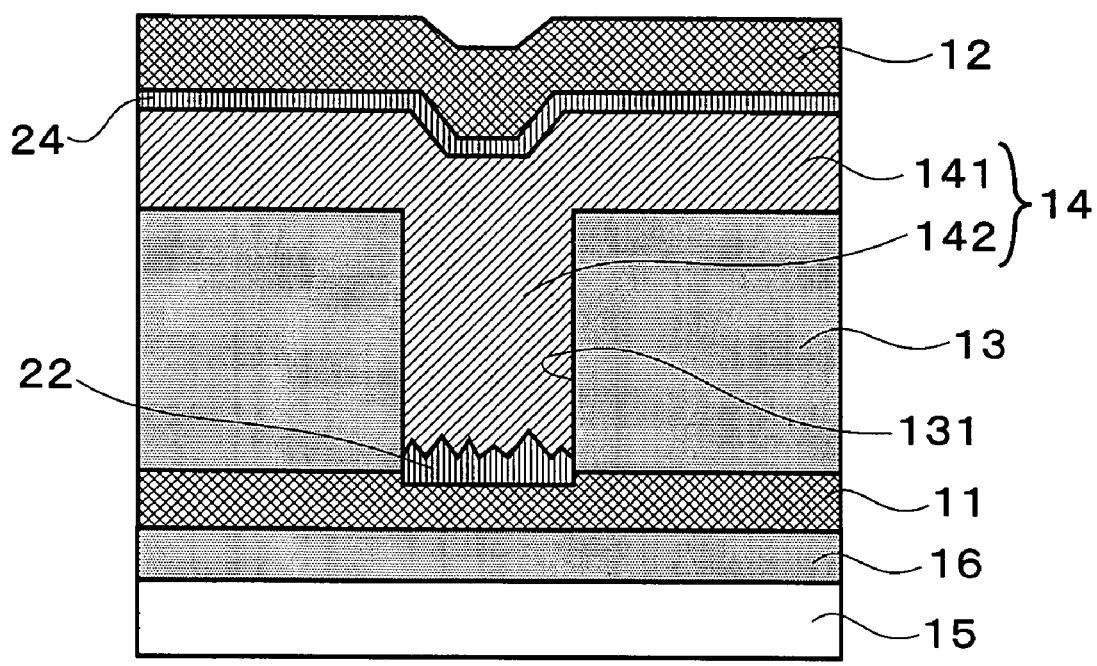
FIG. 6 is a cross-sectional view showing the main parts of a non-volatile memory according to another modified example of the second embodiment of the present invention.

In the structure shown in FIG. 4, the lower metal-oxide layer 22 has a smooth surface; however, it is also possible to provide a rough surface on the lower metal-oxide layer 22 in the portion that is in contact with the phase-change recording medium 14 as shown in FIG. 6. This makes it possible to more readily form a low-resistive filament-like crystal layer by locally concentrated electric fields than the case where the lower metal-oxide layer 22 and the phase-change recording medium 14 come into contact with each other through a flat surface, and therefore reducing the power required to write data while in a set state. Furthermore, because the contact resistance can be reduced by the increased contacting area between the lower metal-oxide layer 22 and the phase-change recording medium 14, it is possible to make the phase-change recording medium 14 amorphous with little power consumption when the memory is reset.

It is possible to control the surface roughness of the lower metal-oxide layer 22 by appropriately controlling the substrate temperature while forming the lower metal-oxide layer 22. That is, when the substrate temperature is raised, the grain size of the particles of the surface of the lower metal-oxide layer 22 becomes larger and the degree of surface roughness increases. On the other hand, when the substrate temperature is lowered, the degree of the surface roughness decreases. To reduce the power consumption required in setting or resetting, it is preferable that the surface roughness of the lower metal-oxide layer 22 be larger; however, when the grain size of the lower metal-oxide layer 22 becomes unduly large, prevention of impurity diffusion may be impaired because impurities tend to diffuse along the grain boundaries. Therefore, it is preferable that the average surface roughness (Ra) of the lower metal-oxide layer 22 be in the range 10 nm to 100 nm (inclusive), based on Japan Industrial Standards (JIS B0601). This can be met by setting the temperature of the substrate, for example, to approximately 350° C.

Figure 7:
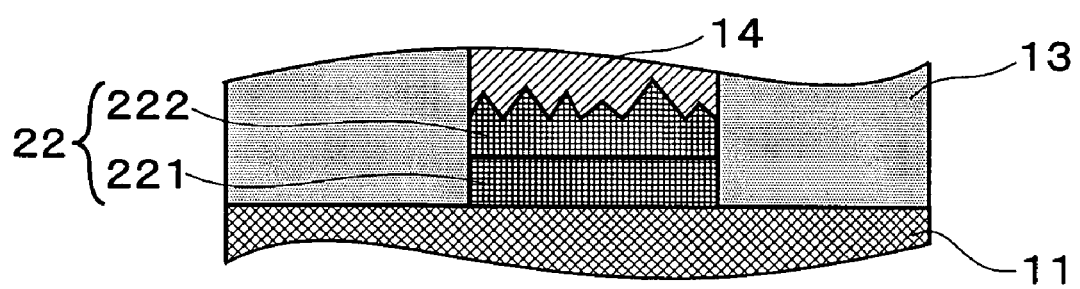
FIG. 7 is a cross-sectional view showing the main parts of a non-volatile memory of yet another modified example of the second embodiment of the present invention.

It is possible to form the lower metal-oxide layer 22 shown in FIG. 6 so as to have a two-layered conductive oxide film structure as shown in FIG. 7. In FIG. 7, the lower metal-oxide layer 22 has a layered structure comprising a first conductive oxide film 221 and a second conductive oxide film 222, wherein the first conductive oxide film 221 has a smaller average grain size or is amorphous, while on the other hand, the second conductive oxide film 222 has a larger average grain size than the first conductive oxide film 221. This structure makes it possible to maintain excellent prevention of impurity diffusion, even when the surface roughness of the conductive oxide film 222 is made greater in the portion that is in contact with the phase-change recording medium 14.

In FIG. 6, a rough surface is provided in the portion where the lower metal-oxide layer 22 comes into contact with the phase-change recording medium 14; however, it is also possible to further provide roughness on the surface where the upper metal-oxide layer 24 comes into contact with the phase-change recording medium 14. This makes it possible to form a rough surface on top of the layered portion 141 of the phase-change recording medium 14, i.e., to provide a rough surface on the rear surface of the upper metal-oxide layer 24 on the portion where it comes into contact with the layered portion 141, so that the power consumption required in setting or resetting can be thereby further reduced.

In the present embodiment, since the lower metal-oxide layer 22 and the upper metal-oxide layer 24 exhibit excellent heat insulation properties in addition to high heat resistance and prevention of impurity diffusion, it is not necessary to form the lower electrode 11 and the upper electrode 12 from high-melting-point metal thin films. It is even possible to use a material having a low melting point such as an aluminum thin film and like metal films for the lower electrode 11 and the upper electrode 12. It is preferable that the lower electrode 11 and the upper electrode 12 have a resistivity lower than that of the metal-oxide layer 22 and the upper metal-oxide layer 24.

Figure 8:
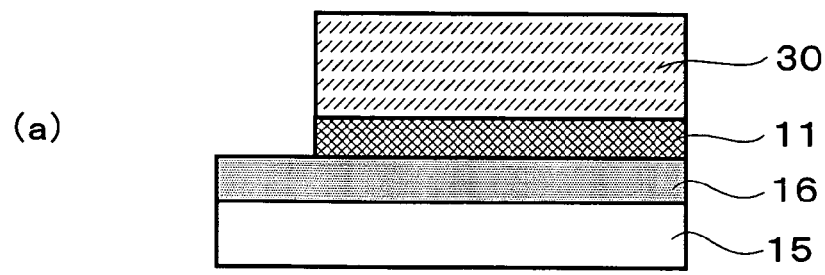
FIGS. 8 and 9 are process drawings that illustrate the fabrication method of the non-volatile memory shown in FIG. 4
Figure 8:
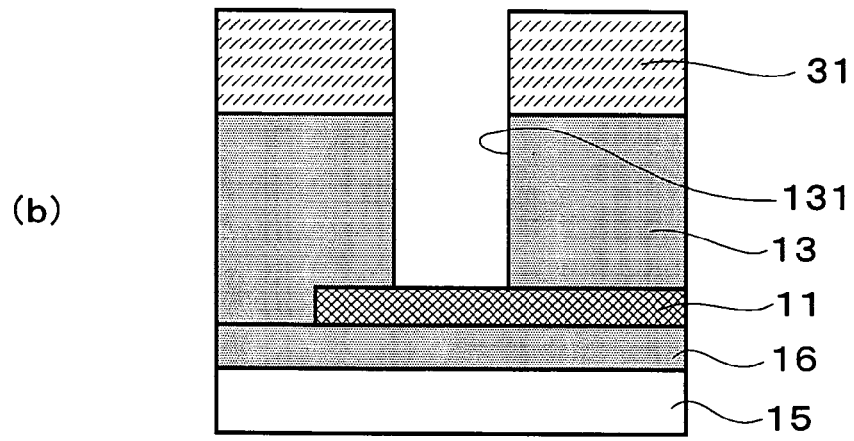
Figure 8:
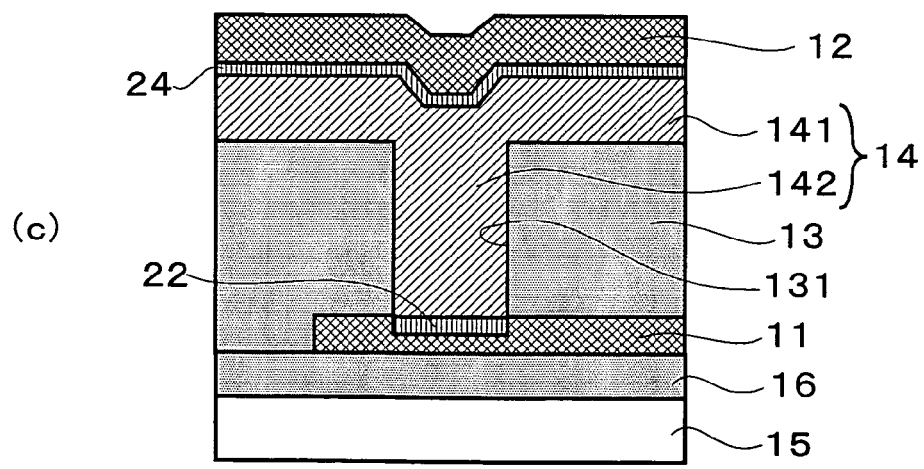
Figure 9:
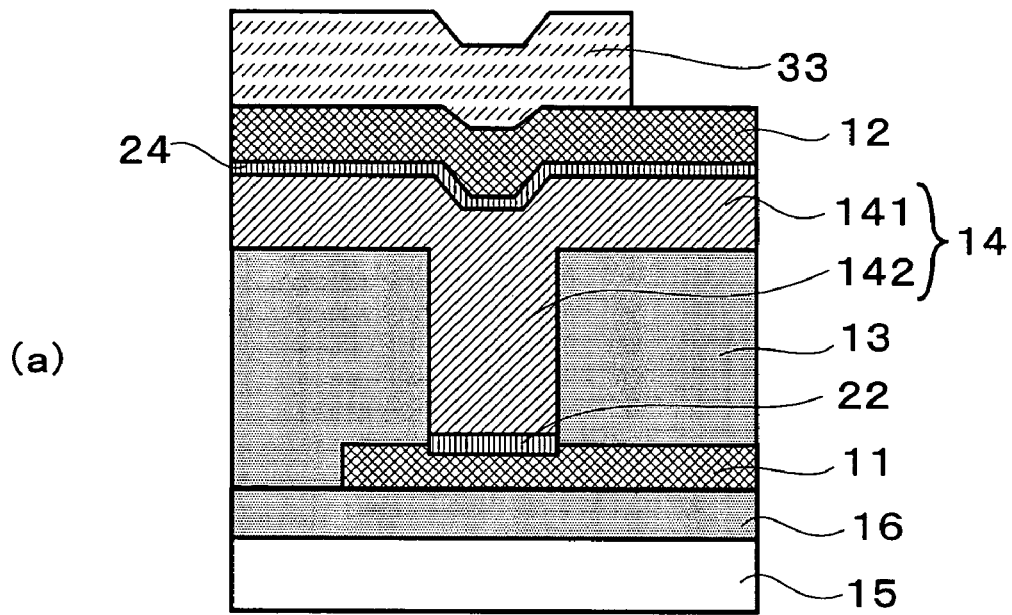
Figure 9:
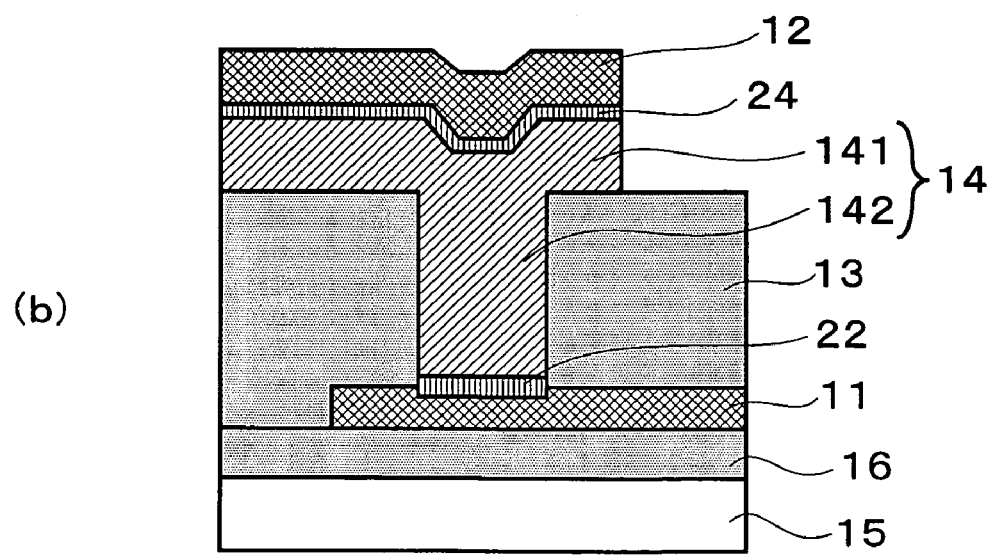

A method for fabricating a non-volatile memory according to the, present embodiment shown in FIG. 4 is explained with reference to FIGS. 8 and 9. First, an insulator 16 and a lower electrode 11 are deposited on a substrate 15 as shown in FIG. 8(a), a resist pattern 30 is formed on the surface of the lower electrode 11 and the lower electrode 11 is formed into a predetermined pattern by dry etching in a photolithography process.

Then, as shown in FIG. 8(b), ashing is conducted by irradiating oxygen plasma, etc., to remove the resist pattern 30; the insulating layer 13 is formed; and a resist pattern 31 is formed thereon and a throughhole 131 is formed in the insulating layer 13 by dry etching in a photolithography step. This exposes a portion of the lower electrode 11. The cross-section of the throughhole 131 is not limited to being cylindrical and may be prismatic.

Next, as shown in FIG. 8(c), the resist pattern 31 is removed by ashing, a heat treatment is conducted at 400° C. in an oxygen atmosphere, so that the exposed portion of the lower electrode 11 is oxidized, thereby forming a lower metal-oxide layer 22 on the surface of the lower electrode 11. Further, a phase-change material containing chalcogen(s) such as GeSbTe, etc., is deposited thereon by sputtering, so that a standing portion 142 is formed in the throughhole 131 and a layered portion 141 is formed on the surface of the insulating layer 13, thereby obtaining the phase-change recording medium 14. Thereafter, using a sputtering apparatus provided with a target of high-melting-point metal such as Ru, etc., the upper metal-oxide layer 24 is formed by reactive sputtering while supplying oxygen gas in the initial stage, and then the upper electrode 12 is formed by general sputtering while supplying Ar gas. As described above, the upper metal-oxide layer 24 and the upper electrode 12 can be formed in the same sputtering apparatus. When a sputtering apparatus provided with a plurality of metal targets such as Ru, Rh, Ir and Os is used, it is possible to readily differentiate the metals contained in the upper metal-oxide layer 24 and the upper electrode 12, for example, in the combination of an upper metal-oxide layer 24 formed of IrO$_2$ and an upper electrode 12 formed of Ru.

Then, a resist pattern 33 is formed by photolithography on the upper electrode 12, and the layered portion 141, the upper metal-oxide layer 24 and the upper electrode 12 as shown in FIG. 9(a) are formed into a predetermined pattern by dry etching. Thereafter, the resist pattern 33 is removed by ashing, completing the phase-change memory shown in FIG. 9(b). As described above, the present fabrication method makes it possible to readily obtain a non-volatile memory exhibiting excellent durability and reliability by following the same processes as in conventional methods.

The fabrication method of a non-volatile memory of the second embodiment of the present invention as shown in FIG. 4 is explained above; however, the other non-volatile memories explained above can be fabricated by substantially the same process. For example, when the non-volatile memory of the first embodiment of the present invention shown in FIG. 1 is fabricated, the steps for forming the lower metal-oxide layer 22 and the upper metal-oxide layer 24 are omitted from the fabrication method described above. When the non-volatile memory shown in FIG. 5 is fabricated, the lower electrode 11 is not subjected to oxidization treatment, and the lower electrode 11 and the lower metal-oxide layer 22 are sequentially formed in the same sputtering apparatus as in the case forming the upper metal-oxide layer 24 and the upper electrode 12.

In the previously-described fabrication method, a resist mask is used as an etching mask; however, it is also possible to use a hard mask formed from a silicon oxide film instead. This method is effective when satisfactory selectivity is not achieved with dry etching due to the resist mask being etched first.

(Third Embodiment)

Figure 10:
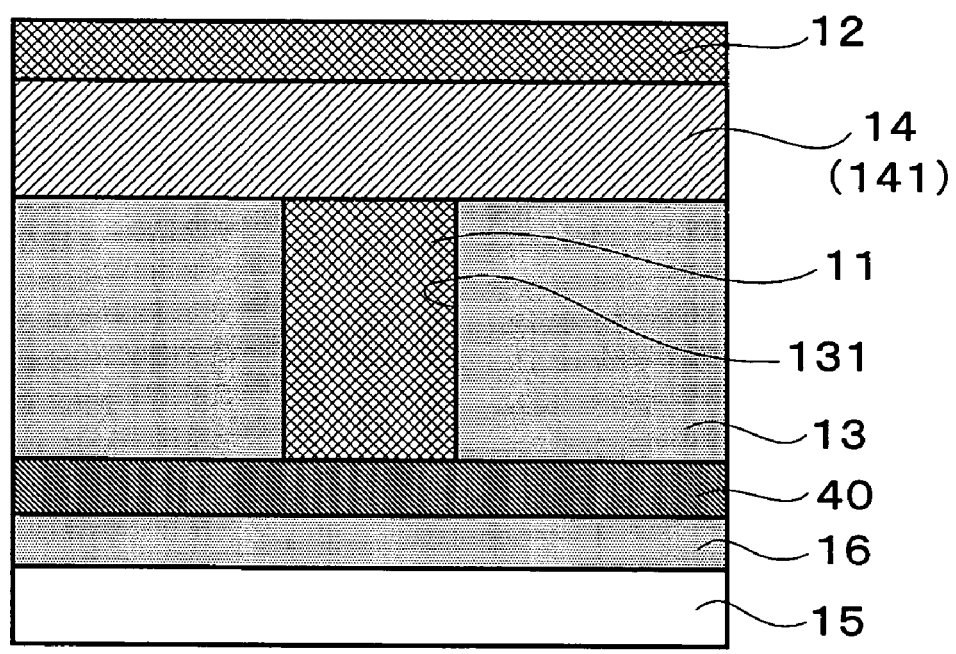
FIG. 10 is a cross-sectional view showing the main parts of a non-volatile memory according to the third embodiment of the present invention.

FIG. 10 is a cross-sectional view showing the main parts of a non-volatile memory according to the third embodiment of the present invention. The non-volatile memory shown in FIG. 10 has a structure in which a standing portion 142 forming part of the phase-change recording medium 14 in the non-volatile memory shown in FIG. 1 is replaced with a lower electrode 11 to hold a layered portion 141 between the lower electrode 11 that fills in the throughhole 131 and an upper electrode 12. The lower end of the lower electrode 11 is connected to a metal wiring layer 40 formed from an aluminum film or the like that is disposed on a substrate 15 having an insulator 16 in between. In FIG. 10, the same reference numbers are used for the same constituent components shown in FIG. 1 and a detailed explanation thereof is omitted.

The non-volatile memory shown in FIG. 10 exhibits the same effects as the non-volatile memory shown in FIG. 1, and has the further advantage that filling a material into the throughhole 131 can be readily performed because the material fills in the throughhole 131 in the insulating layer 13 is not a phase-change material that forms the standing portion 142 but a high-melting-point metal that forms the lower electrode 11.

In other words, in the structure shown in FIG. 1, formation of the phase-change recording medium 14 comprising the layered portion 141 and the standing portion 142 is usually conducted by sputtering; however, since a film that is formed by sputtering generally has poor step coverage, it is difficult to fill the throughhole 131 with the phase-change material in a uniform manner. In contrast, in the structure shown in FIG. 10, it is possible to uniformly fill the throughhole 131 with the material by forming a metal film on the insulating layer 13 by chemical vapor deposition (CVD) or plating method using an organometallic material and grinding down the metal film on the surface by chemical machinery polishing (CMP). This reduces the voltage applied to set or reset the memory by forming the layered portion 141 from a thin film and reduces the current applied to set or reset the memory by increasing the aspect ratio (depth/diameter) of the lower electrode 11 that fills the throughhole 131, reducing power consumption of the non-volatile memory.

In the non-volatile memory shown in FIG. 10, it is also possible to provide an oxide layer between the pairs of phase-change recording medium 14 and the lower electrode 11, and between the phase-change recording medium 14 and the upper electrode 12. The non-volatile memory shown in FIG. 11 has a structure in which a lower metal-oxide layer 22 and an upper metal-oxide layer 24 are disposed between the pairs of the lower electrode 11 and the phase-change recording medium 14, and the phase-change recording medium 14 and the upper electrode 12, respectively, of the non-volatile memory shown in FIG. 10. In other respects, the constitution is the same as that of the non-volatile memory shown in FIG. 10.

Figure 11:
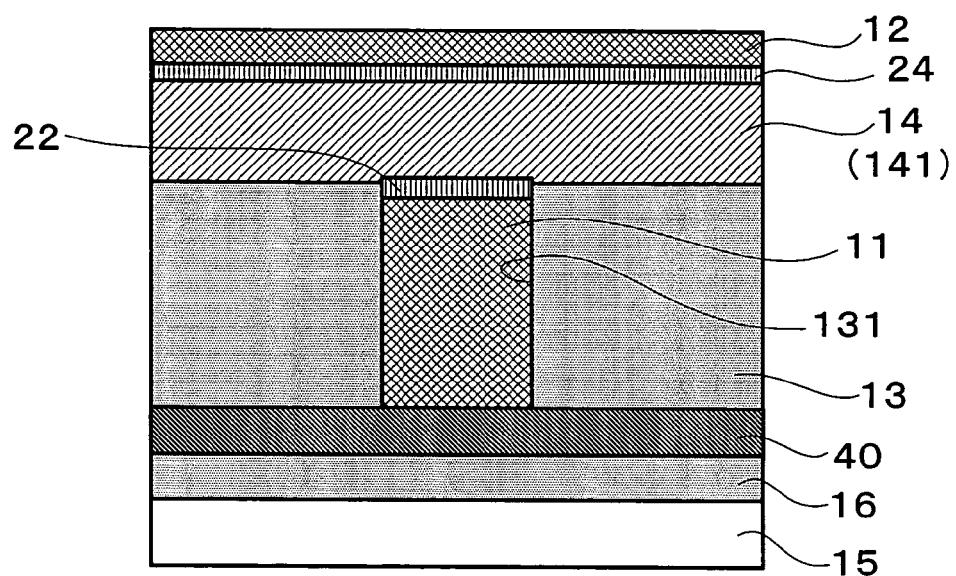
FIG. 11 is a cross-sectional view showing the main parts of a non-volatile memory according to a modified example of the third embodiment of the present invention.
Figure 12:
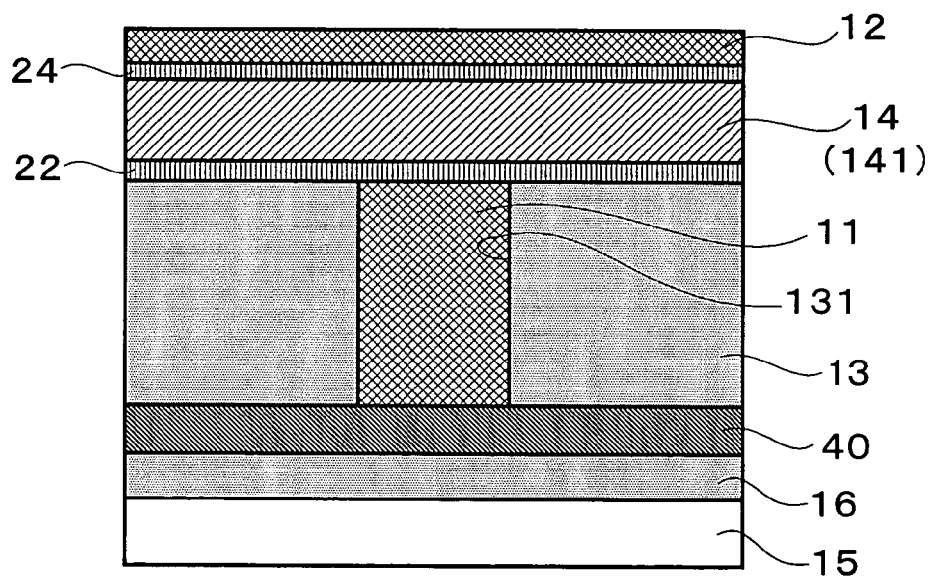
FIG. 12 is a cross-sectional view showing the main parts of a non-volatile memory according to another modified example of the third embodiment of the present invention.

In the structure shown in FIG. 11, the lower metal-oxide layer 22 is formed only in the region where the phase-change recording medium 14 overlays the lower electrode 11 as seen in a plan view; however, it is also possible, as shown in FIG. 12, to form the lower metal-oxide layer 22 on the entire surface of the insulating layer 13 so that the lower electrode 11 comes into contact with a portion of the lower metal-oxide layer 22. Thereby, as in the structures shown in FIG. 4 and FIG. 5, it is possible to reduce power consumption required in setting or resetting.

Figure 13:
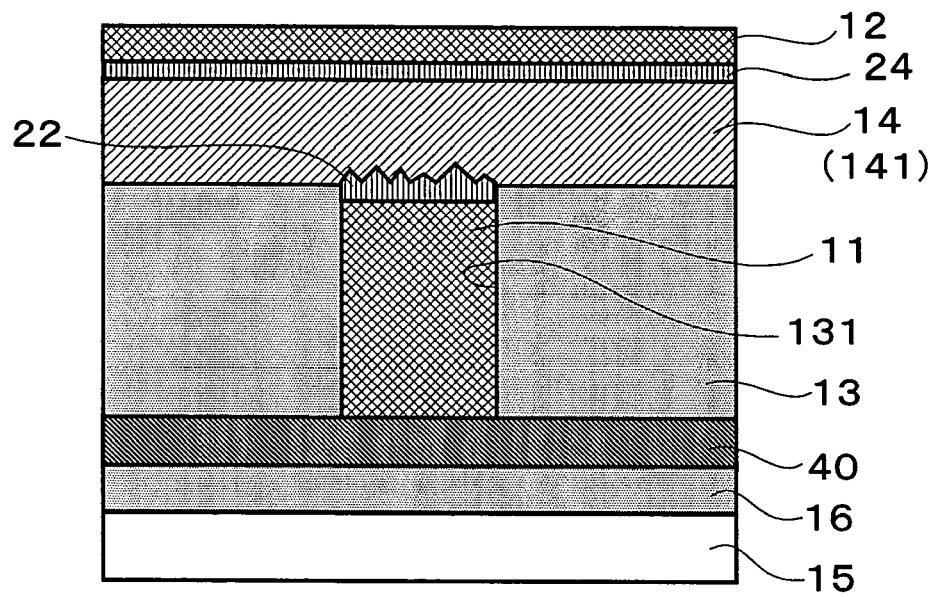
FIG. 13 is a cross-sectional view showing the main parts of a non-volatile memory according to yet another modified example of the third embodiment of the present invention.
Figure 14:
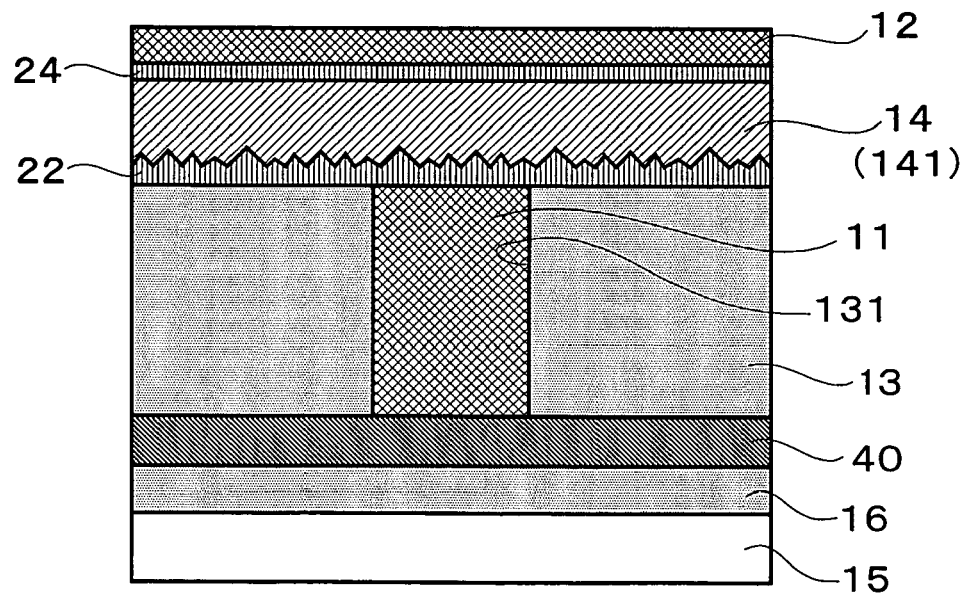
FIG. 14 is a cross-sectional view showing the main parts of a non-volatile memory according to still another modified example of the third embodiment of the present invention.

In the structures shown in FIGS. 11 and 12, the lower metal-oxide layer 22 has a flat surface; however, it is also possible to provide a rough surface on the lower metal-oxide layer 22 in the portion where it comes into contact with the phase-change recording medium 14, as shown in FIGS. 13 and 14. This arrangement makes it possible to further reduce the power consumption required in setting or resetting, as in the structure shown in FIG. 6. As described above, it is preferable that the average surface roughness (Ra) of the lower metal-oxide layer 22 be in the range from 10 nm to 100 nm (inclusive) measured in accordance with Japan Industrial Standards (JIS B0601). As in the structure shown in FIG. 7, it is also possible to structure the lower metal-oxide layer 22 as to comprise a first conductive oxide film 221 and a second conductive oxide film 222 arranged in a layered manner.

In FIGS. 13 and 14, a rough surface is provided on the portion where the lower metal-oxide layer 22 comes into contact with the phase-change recording medium 14; however, it is also possible to further provide a rough surface on the surface where the upper metal-oxide layer 24 comes into contact with the phase-change recording medium 14. In this case, by providing roughness on the surface of the phase-change recording medium 14, it is possible to provide a roughness on the portion where the upper metal-oxide layer 24 comes into contact with the phase-change recording medium 14, which is located on the rear surface of the upper metal-oxide layer 24. This allows further reduction of power consumption required in setting or resetting.

In the present embodiment, since the lower metal-oxide layer 22 and the upper metal-oxide layer 24 exhibit excellent heat insulation properties in addition to high heat resistance and prevention of impurity diffusion, it is not necessary to form the lower electrode 11 and the upper electrode 12 from high-melting-point metal thin films. Materials having a low melting point such as aluminum thin film and other metal films can be used for the lower electrode 11 and the upper electrode 12. It is preferable that the lower electrode 11 and the upper electrode 12 have a resistivity lower than that of the metal-oxide layer 22 and the upper metal-oxide layer 24.

Figure 15:
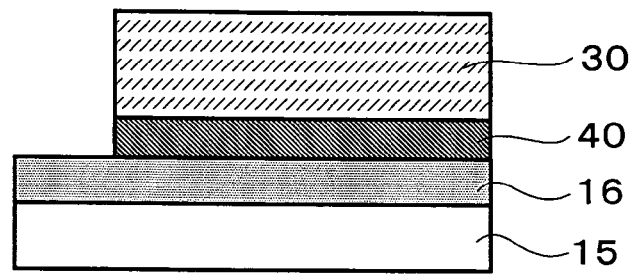
FIGS. 15 and 16 are process drawings that illustrate the fabrication method of the non-volatile memory shown in FIG. 11.
Figure 15:
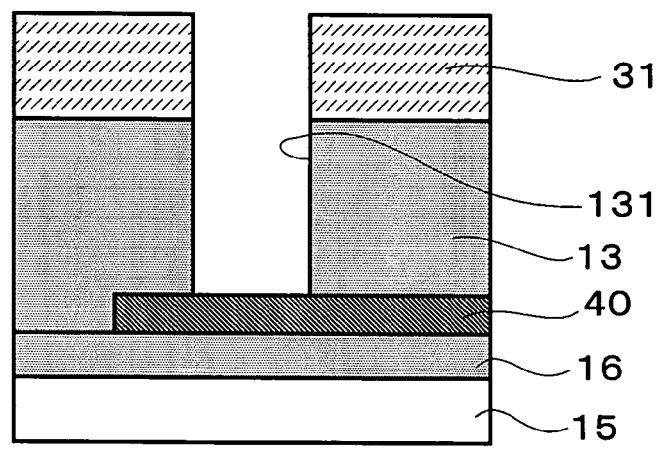
Figure 15:
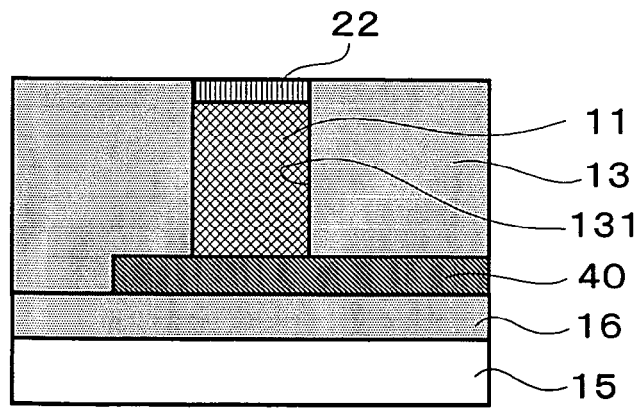
Figure 16:
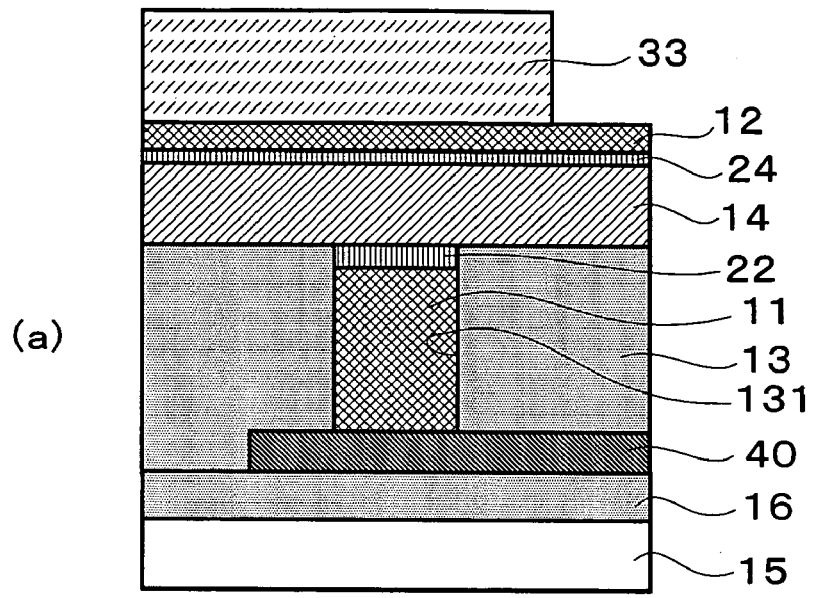
Figure 16:
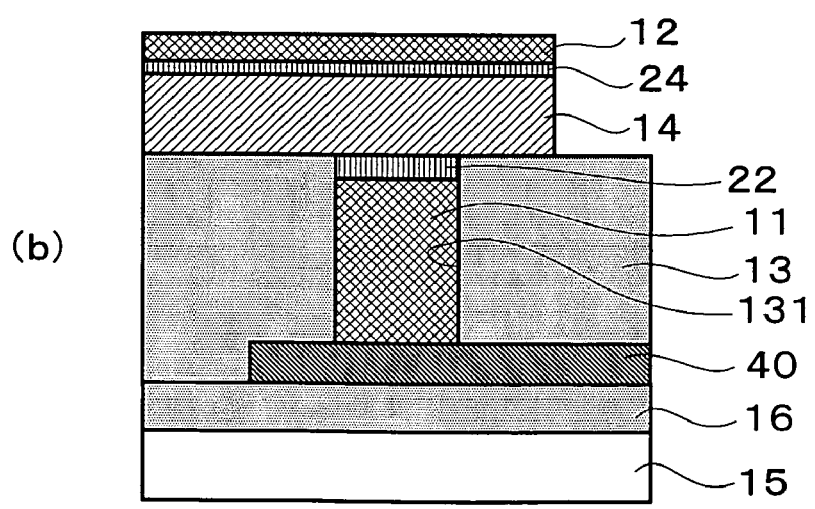

Next, a method for fabricating a non-volatile memory according to the present embodiment shown in FIG. 11 is explained with reference to FIGS. 15 and 16. First, an insulator 16 and a metal wiring film 10 are deposited on a substrate 15 as shown in FIG. 15(a), a resist pattern 30 is formed on the surface of the lower electrode 11 and patterning of the metal wiring film 40 is conducted by dry etching in a photolithography process.

Then, as shown in FIG. 15(b), after removing the resist pattern 30 by subjecting it to ashing by irradiating oxygen plasma, etc., an insulating layer 13 is formed thereon. A resist pattern 31 is deposited and a throughhole 131 is formed in the insulating layer 13 by dry etching in a photolithography process. This exposes a portion of the metal wiring film 40.

Next, as shown in FIG. 15(c), after removing the resist pattern 31 by ashing, a high-melting-point metal that contains a main ingredient at least one member selected form the group consisting of Ru, Rh and Os as is deposited on the insulating layer 13 by CVD, and the surface of the metal thin film on the insulating layer 13 is ground down by chemical machinery polishing (CMP). Thereby, the high-melting-point metal is selectively left in the throughhole 131 to form the lower electrode 11. Then, heat treatment is conducted at 400° C. in an oxygen atmosphere, and a lower metal-oxide layer 22 is formed in the throughhole 131 by oxidizing the surface of the lower electrode 11.

Subsequently, as shown in FIG. 16(a), a phase-change material that contains chalcogen(s) such as GeSbTe, etc., is deposited on the insulating layer 13 by sputtering to form a phase-change recording medium 14 having a layered structure. Thereafter, using a sputtering apparatus provided with a target of high-melting-point metal such as Ru, etc., an upper metal-oxide layer 24 is formed by reactive sputtering while supplying oxygen gas in the initial stage, and then the upper electrode 12 is formed by general sputtering while supplying Ar gas. As described above, the upper metal-oxide layer 24 and the upper electrode 12 can be formed in the same sputtering apparatus. When a sputtering apparatus provided with a plurality of metal targets such as Ru, Rh, Ir and Os is used, it is possible to readily differentiate the metals contained in the upper metal-oxide layer 24 and the upper electrode 12, for example, in the combination of an upper metal-oxide layer 24 formed of $IrO_2$ and an upper electrode 12 formed of Ru.

In a photolithography process, resist pattern 33 is then formed on the upper electrode 12, and the phase-change recording medium 14, the upper metal-oxide layer 24 and the upper electrode 12 are patterned into a predetermined shape by dry etching. Thereafter, the resist pattern 33 is removed by ashing, completing the phase-change memory shown in FIG. 16(b). As described above, the present fabrication method can readily provide a non-volatile memory exhibiting excellent durability and reliability by following the same processes as in conventional methods.

The above explanation relates to the method for fabricating the non-volatile memory of the third embodiment of the present invention shown in FIG. 11. However, the other non-volatile memories of the present embodiment can be fabricated by substantially the same process. For example, when a non-volatile memory having the structure shown in FIG. 10 is fabricated, the steps for forming the lower metal-oxide layer 22 and the upper metal-oxide layer 24 are omitted from the above explanation. When a non-volatile memory shown in FIG. 12 is fabricated, instead of oxidizing the upper portion of the lower electrode 11, it is possible to form the lower metal-oxide layer 22 on the entire surface of the insulating layer 13 by reactive sputtering.

In the previously-described fabrication method, a resist mask is used as an etching mask; however, it is also possible to use a hard mask formed from a silicon oxide film instead. This method is effective when satisfactorily selectivity is not achieved with dry etching due to the resist mask being etched first.

(Fourth Embodiment)

Figure 17:
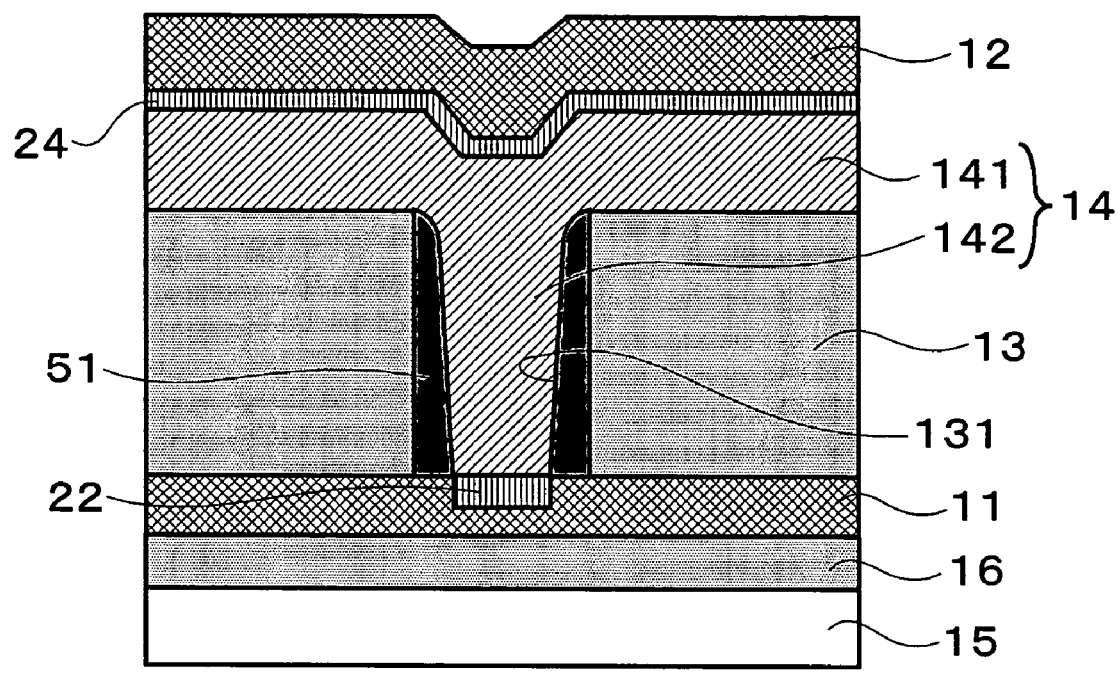
FIG. 17 is a cross-sectional view showing the main parts of a non-volatile memory according to the fourth embodiment of the present invention.
Figure 18:
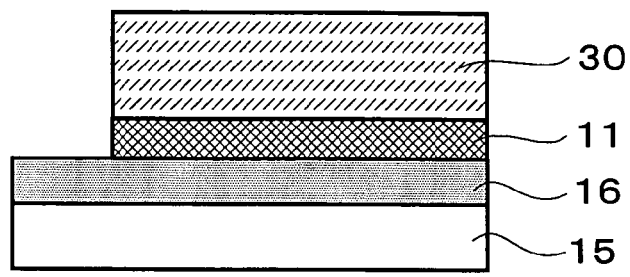
FIGS. 18 and 19 are process drawings that illustrate the fabrication method of the non-volatile memory shown in FIG. 17.
Figure 18:
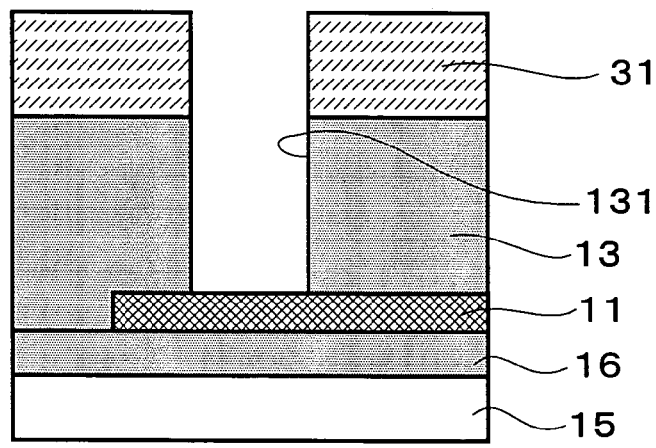
Figure 18:
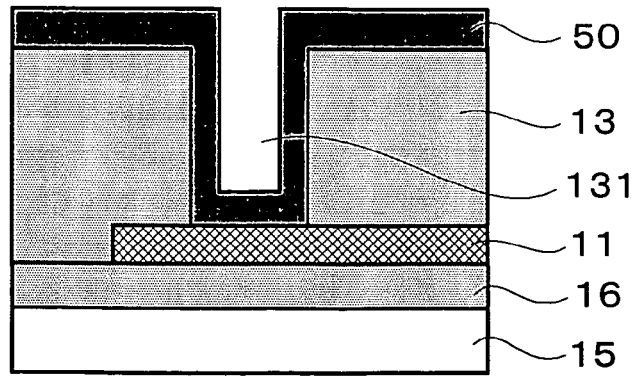
Figure 19:
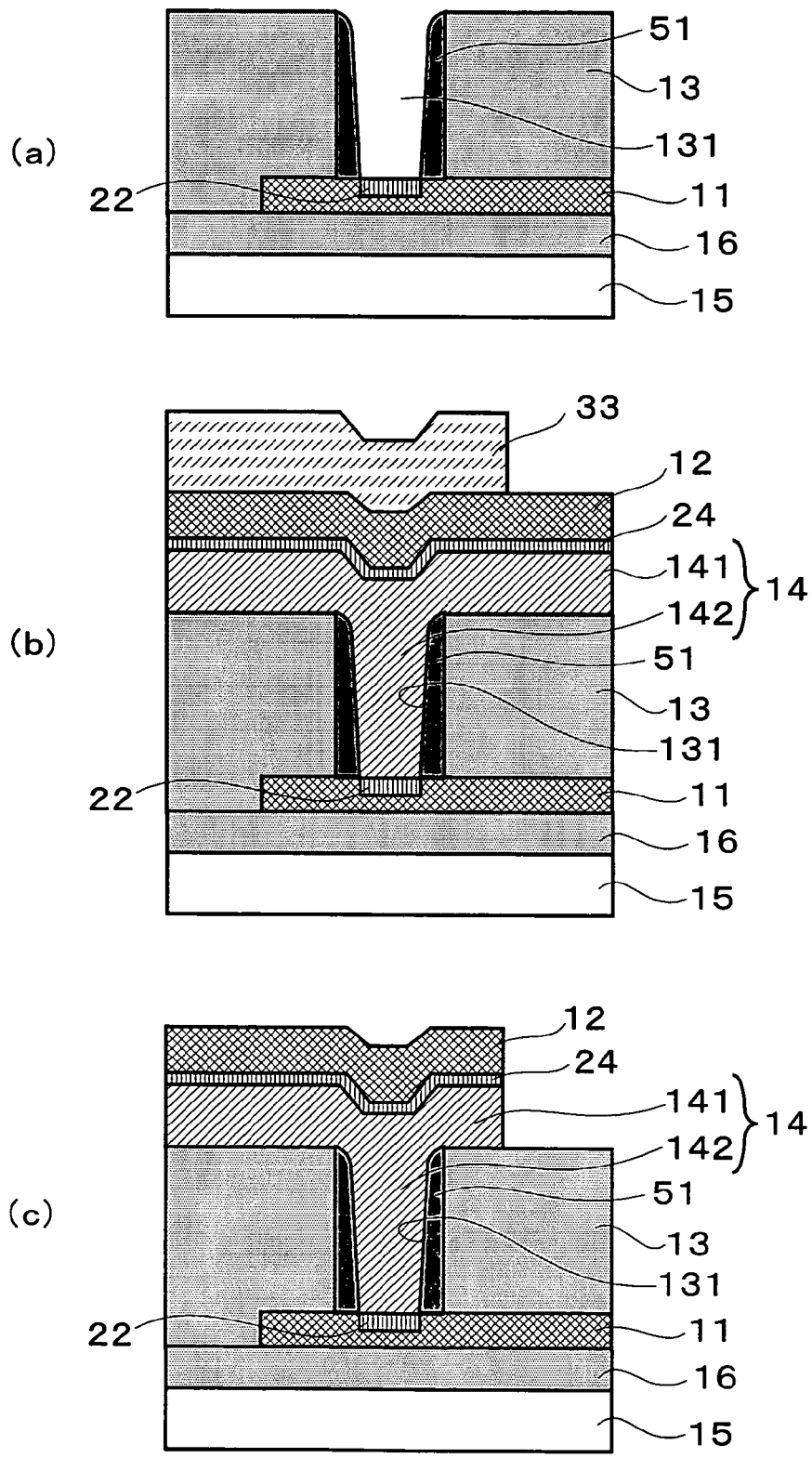

FIG. 17 is a cross-sectional view showing the main parts of a non-volatile memory according to the fourth embodiment of the present invention. The non-volatile memory according to the fourth embodiment has the same structure as that of the second embodiment shown in FIG. 4 except that the diameter of the throughhole 131 is reduced by providing an insulating tube 51 formed along the inner surface of the throughhole 131. The method for fabricating this non-volatile memory is explained with reference to FIGS. 18 and 19.

First, an insulator 16 and a lower electrode 11 are deposited on a substrate 15 as shown in FIG. 18(a), a resist pattern 30 is formed on the surface of the lower electrode 11 and patterning of the lower electrode 11 is conducted by dry etching in a photolithography process.

Then, as shown in FIG. 18(b), after removing the resist pattern 30 by ashing by irradiating oxygen plasma, etc., an insulating layer 13 is formed. Thereafter, in a photolithography process, a resist pattern 31 is deposited and a throughhole 131 is formed in the insulating layer 13 by dry etching to expose a portion of the lower electrode 11.

Then, as shown in FIG. 18(c), after removing the resist pattern 31 by ashing, an insulating-material coating film 50 of silicon nitride, etc., is formed on the surface of the insulating layer 13 by CVD, by which means excellent step coverage is achieved. To provide the throughhole 131 with sufficient interior volume, it is necessary that the cross-sectional area of the insulating-material coating film 50 be less than ½ of the cross-sectional area of the throughhole 131.

When the entire surface of the insulating-material coating film 50 is subjected to etchback with dry etching by which the insulating layer 13 and the insulating-material coating film 50 are etched with a high selectivity, the insulating tube 51 contacted to the interior surface of the throughhole 131 is formed as shown in FIG. 19(a). Heat treatment is then conducted at 400° C. in an oxygen atmosphere and the exposed portion of the lower electrode 11 is oxidized, forming a lower metal-oxide layer 22 on the bottom portion of the throughhole 131.

Subsequently, as shown in FIG. 19(b), a phase-change material containing chalcogen(s) such as GeSbTe, etc., is deposited by sputtering, so that a standing portion 142 is formed in the throughhole 131 and a layered portion 141 is formed on the surface of the insulating layer 13, thereby obtaining a phase-change recording medium 14. Thereafter, using a sputtering apparatus provided with a target of high-melting-point metal such as Ru, etc., an upper metal-oxide layer 24 is formed by reactive sputtering while supplying oxygen gas in the initial stage, and then an upper electrode 12 is formed by general sputtering while supplying Ar gas. As described above, the upper metal-oxide layer 24 and the upper electrode 12 can be formed in the same sputtering apparatus. When a sputtering apparatus provided with a plurality of metal targets such as Ru, Rh, Ir and Os is used, it is possible to readily differentiate the metals contained in the upper metal-oxide layer 24 and the upper electrode 12, for example, in the combination of an upper metal-oxide layer 24 formed of $IrO_2$ and an upper electrode 12 formed of Ru. A resist pattern 33 is then formed on the upper electrode 12.

Next, the layered portion 141, the upper metal-oxide layer 24 and the upper electrode 12 are patterned into a predetermined shape by dry etching, and, after forming an upper wiring (not shown), the resist pattern 33 is removed by ashing, and the phase-change memory shown in FIG. 19(c) is thereby completed.

Accordingly, the fabrication method of the present embodiment makes it possible to readily fabricate a non-volatile memory exhibiting excellent durability and reliability by following the same processes as in conventional methods. In particular, in the present embodiment, the standing portion 142 can be made smaller by forming the insulating tube 51 along the inner surface of the throughhole 131. This reduces the power consumption required in setting or resetting the memory. Furthermore, by making the thermal conductivity of the insulating tube 51 lower than that of the insulating layer 13, heat losses during application of current can be reduced. This also reduces the power consumption required in setting or resetting. In addition, in the fabrication method of the present embodiment, several variations on the structure are possible, for example, the above-described steps for forming the lower oxide layer 22 and the upper oxide layer 24 can be omitted.

Figure 20:
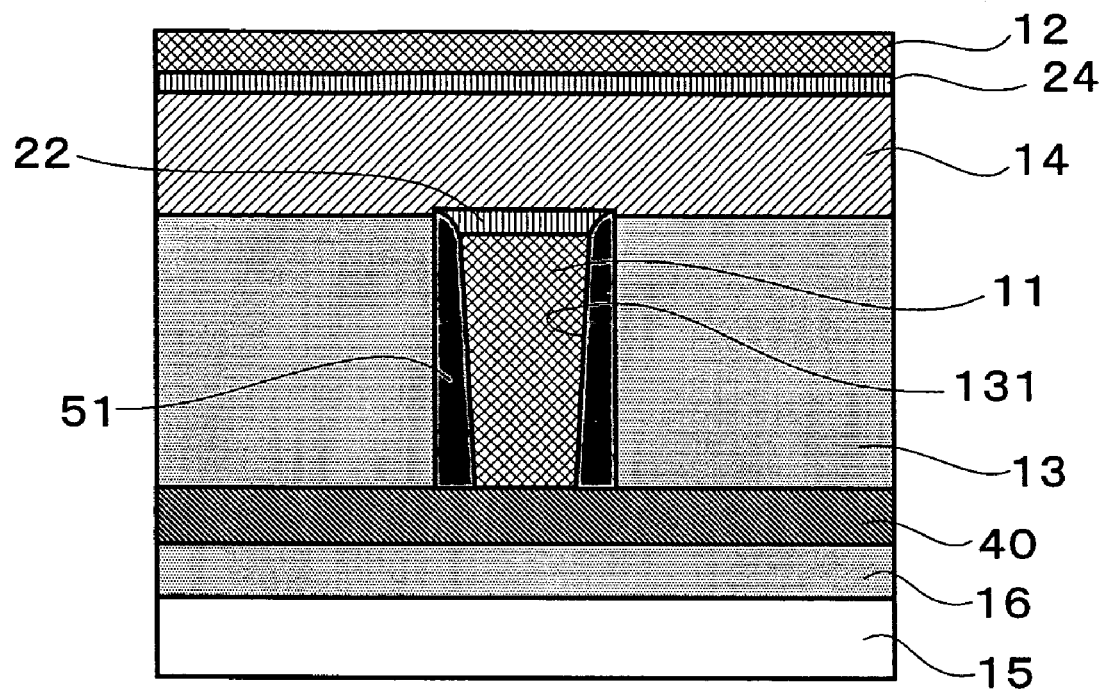
FIG. 20 is a cross-sectional view showing the main parts of a non-volatile memory according to a modified example of the fourth embodiment of the present invention.

In the structure shown in FIG. 17, a phase-change material fills in the throughhole 131 having the insulating tube 51 formed therein; however, it is also possible that, as shown in FIG. 20, a high-melting-point metal can fill in the throughhole 131 having the insulating tube 51 formed therein. In this case, in the method for fabricating the non-volatile memory of the third embodiment of the present invention shown in FIG. 11, an insulating tube 51 can be formed after the formation of the throughhole 131 by following the same processes as in the present embodiment.

INDUSTRIAL APPLICABILITY

As described above, the present invention can provide a non-volatile memory having improved durability and reliability by preventing deterioration of property (i.e., mutual impurity diffusion between the electrode and the phase-change recording medium) caused by application of current, and a fabrication method thereof.

The invention claimed is:

1. A non-volatile memory comprising:
a first electrode;
a second electrode; and
a phase-change recording medium sandwiched between the first electrode and the second electrode, in which resistance value is varied by application of an electrical pulse across the first electrode and the second electrode; wherein
at least one of the first electrode and the second electrode contains ruthenium as a main ingredient; and
the phase-change recording medium is formed of GeSbTe.

2. A non-volatile memory according to claim 1, wherein
an insulating layer lies between the first electrode and the second electrode;
the insulating layer comprises a throughhole; and
the phase-change recording medium comprises a standing portion filling the throughhole.

3. A non-volatile memory according to claim 2, wherein the standing portion has a straight tube shape.

4. A non-volatile memory according to claim 2, wherein
the phase-change recording medium further comprises a layered portion sandwiched between the insulating layer and either the first electrode or the second electrode; and
the standing portion is formed so as to extend from the layered portion in a substantially perpendicular direction.

5. A non-volatile memory according to claim 2, which further comprises an insulating tube that is formed along the inner surface of the throughhole and that has a thermal conductivity lower than that of the insulating layer.

6. A non-volatile memory according to claim 1, wherein a metal-oxide layer containing at least one member selected from the group consisting of ruthenium, rhodium, iridium and osmium lies between at least one of the pairs of the first electrode and the phase-change recording medium, and the phase-change recording medium and the second electrode.

7. A non-volatile memory according to claim 6, wherein a rough surface is provided on the metal-oxide layer in the region where it comes into contact with the phase-change recording medium.

8. A non-volatile memory according to claim 7, wherein the surface where the metal-oxide layer comes into contact with the phase-change recording medium has an average roughness (Ra) of from not smaller than 10 nm to not greater than 100 nm.

9. A non-volatile memory according to claim 7, wherein
the metal-oxide layer has a multi-layered structure comprising a first conductive oxide film that has a small average grain size or that is amorphous and a second conductive oxide film that has an average grain size greater than that of the first conductive oxide film; and
the surface of the second oxide conductive film is structured so as to contact with the phase-change recording medium.

10. A non-volatile memory according to claim 6, wherein the metal-oxide layer is a conductive oxide layer having a tetragonal rutile structure.

11. A non-volatile memory according to claim 1, which further comprises a substrate and an insulating layer formed on the substrate, wherein
the insulating layer comprises a throughhole;
the first electrode fills in the throughhole; and
the phase-change recording medium forms a layered structure on the surface of the insulating layer.

12. A non-volatile memory according to claim 11, wherein a metal-oxide layer containing at least one member selected from the group consisting of ruthenium, rhodium, iridium and osmium lies between at least one of the pairs of the first electrode and the phase-change recording medium, and the phase-change recording medium and the second electrode.

13. A non-volatile memory according to claim 12, wherein a rough surface is provided on the metal-oxide layer in the region where it comes into contact with the phase-change recording medium.

14. A non-volatile memory according to claim 13, wherein the surface region where the metal-oxide layer comes into contact with the phase-change recording medium has an average roughness (Ra) not smaller than 10 nm to not greater than 100 nm.

15. A non-volatile memory according to claim 13, wherein
the metal-oxide layer has a multi-layered structure comprising a first oxide conductive film that has a small average grain size or that is amorphous and a second oxide conductive film that has an average grain size greater than that of the first oxide conductive film; and
the surface of the second oxide conductive film is structured so as to contact with the phase-change recording medium.

16. A non-volatile memory according to claim 11, which further comprises an insulating tube that is formed along the inner surface of the throughhole and that has a thermal conductivity lower than that of the insulating layer.

* * * * *

UNITED STATES PATENT AND TRADEMARK OFFICE
CERTIFICATE OF CORRECTION

| | |
|---|---|
| PATENT NO. | : 7,023,014 B2 |
| APPLICATION NO. | : 10/716621 |
| DATED | : April 4, 2006 |
| INVENTOR(S) | : Morimoto et al. |

It is certified that error appears in the above-identified patent and that said Letters Patent is hereby corrected as shown below:

On the title page

Item (30) Foreign Application Priority Data, delete "Jul. 1, 2003 (WO)...............PCT/JP03/08349 "

Under Item (22) insert Item --(63) Related U.S. Application Data, Continuation of International Application PCT/JP03/08349, filed July 1, 2003 --

Signed and Sealed this

Sixteenth Day of October, 2007

JON W. DUDAS
*Director of the United States Patent and Trademark Office*